United States Patent [19]

Holzner et al.

[11] 4,149,096

[45] Apr. 10, 1979

[54] SWITCHING MATRIX WITH CONNECTION MODULES

[75] Inventors: Franz Holzner, Wolfratshausen; Ulrich Schmid; Kurt Strittmatter, both of Munich, all of Fed. Rep. of Germany

[73] Assignee: Siemens Aktiengesellschaft, Berlin & Munich, Fed. Rep. of Germany

[21] Appl. No.: 811,873

[22] Filed: Jun. 30, 1977

[30] Foreign Application Priority Data

Jul. 9, 1976 [DE] Fed. Rep. of Germany ....... 2630993

[51] Int. Cl.² ................. H02B 13/06; H04Q 1/16; H04Q 1/56
[52] U.S. Cl. .................... 307/115; 340/166 R
[58] Field of Search ............. 307/112, 113, 115; 340/166 R, 147 R, 147 SY, 147 T

[56] References Cited

U.S. PATENT DOCUMENTS 3,597,738  8/1971  Joslow .......................... 340/166 R
3,673,568  6/1972  Terry ........................... 340/166 R Primary Examiner—L. T. Hix
Assistant Examiner—S. D. Schreyer
Attorney, Agent, or Firm—Hill, Gross, Simpson, Van Santen, Steadman, Chiara & Simpson

[57] ABSTRACT

A switching matrix utilizing connection modules, for the connection of peripherally arranged electrical measuring devices, over selectable lines of a line group specifically associated with a matrix, to the peripheral terminals of specimens to be measured, such as electrical components, circuit board, assemblies, communication devices and the like, wherein the connection modules are designed with two poles, each of which is selectively connectable to a respective peripheral terminal of a specimen or a device over controllable switching means, and further controllable switching means for selectively connecting the first pole of a connection module to the second pole thereof at the matrix side of the first mentioned switching means associated with such second pole, in the event said last mentioned switching means is open, each of such poles providing access from such a terminal to separate line subgroups, from which a line is then selected over additional controllable switching means.

6 Claims, 3 Drawing Figures

SWITCHING MATRIX WITH CONNECTION MODULES

BACKGROUND OF THE INVENTION

The invention relates to a switching matrix employing connection modules for connecting peripherally arranged measuring devices and the like, over selectable lines of a line group specifically assigned to the matrix, to the peripheral terminals of objects or specimens to be measured, such as electrical components, circuit boards, assemblies, communication devices, and the like, wherein the connection modules are designed with two poles over which access may be provided to separate line subgroups over controllable switching means, with a line then being selected by further controllable switching means.

A switching means of this general type is known, for example from German OS 22 28 881, in particular FIG. 3 thereof, in which the formation of two sub-groups produces the possibility of providing two types of lines which enjoy equal priority with one another, and are specifically assigned to the matrix, and over which, for example, signals having different level values may be separately transmitted. However, in order to enable the selection of each of the existing matrix lines from the peripheral measuring device terminals or specimens terminals, it is necessary in this known switching matrix to assign each individual terminal to a two-pole connection module which is relatively expensive.

BRIEF SUMMARY OF THE INVENTION

The invention, therefore, has among its objects, the production of a switching matrix of the type referred to, in which a considerable reduction in circuit outlay may be achieved without involving too great a limitation with respect to the access facilities to the selectable lines associated with the matrix, as compared to the known type of system.

This is achieved in accordance with the invention by the connection of each pole of a two-pole connection module to a respective peripheral device terminal or specimen terminal, and the provision of controllable switches over which the peripheral sides of the controllable switching means which are assigned to the first pole of a two-pole connection module can be connected to the matrix side of the corresponding controllable switching means associated with the second pole of such module, when the last mentioned controllable switching means is open, i.e., does not effect an actuation of the second pole whereby it is connected to the associated terminal.

The invention has the advantage that, as a result of the individual coordination between the individual poles of the connection modules and the peripheral terminals of the devices and specimens, it is possible, in extensive measuring systems, to effect a saving of a large number of connection modules, and in addition, enable access to free lines of another line subgroup for line connection when all of the lines of the normally employable line subgroup are in use. Consequently, seizure peaks, which occur only in specific, in particular extensive measuring device interconnections, can be handled without difficulties by employing the maximum line capacity available. This is of considerable significance and importance, in particular when the switching matrix is employed in connection with programmable automatic measuring equipment.

BRIEF DESCRIPTION OF THE DRAWINGS

In the drawings wherein like reference characters indicate like or corresponding parts.

DETAILED DESCRIPTION OF THE INVENTION

Figure 1:
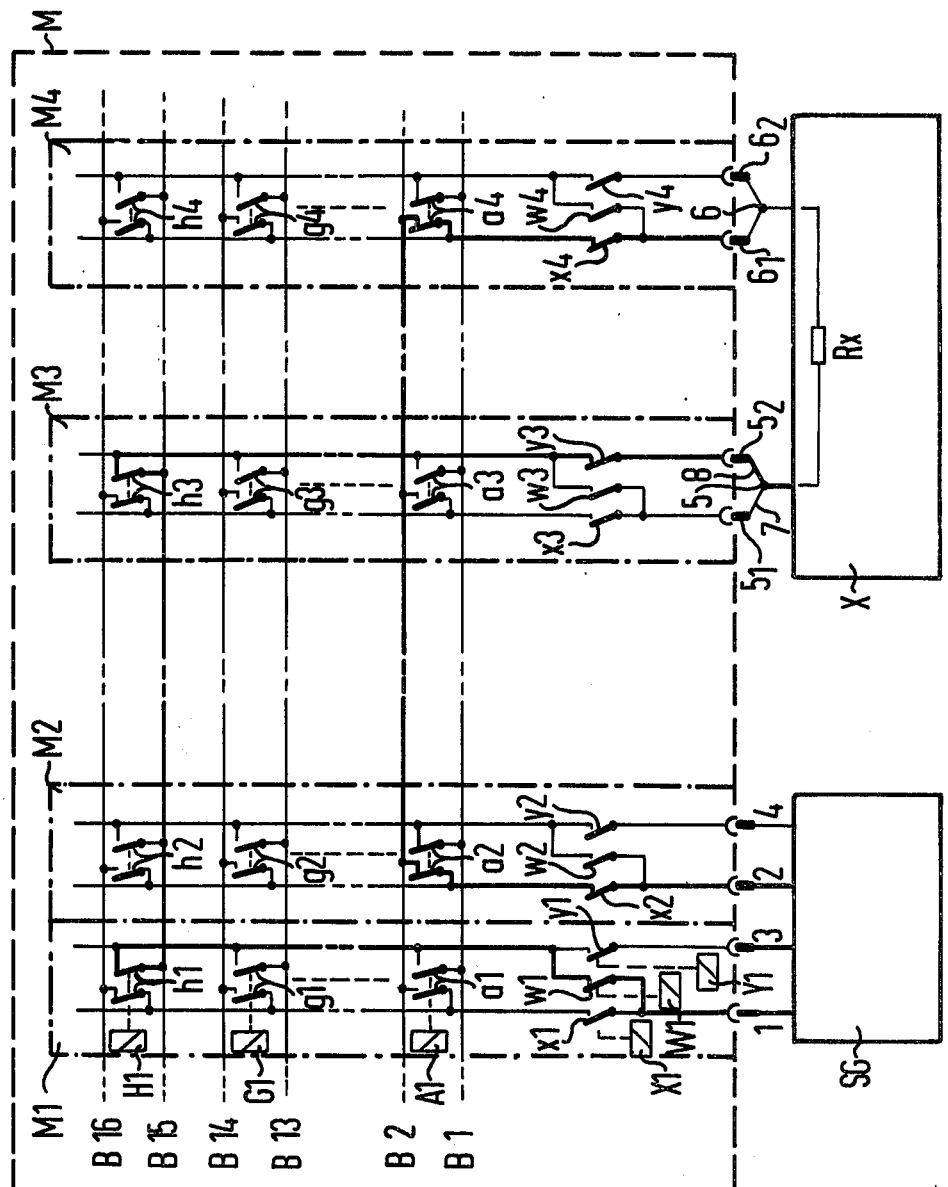
FIG. 1 is a basic circuit diagram of an example of the present invention.

Referring to FIG. 1, which, by way of example, illustrates merely two units which are to be connected to one another, the reference character SG designates a four-pole current supply device having terminal pairs 1, 2 and 3, 4 while the reference character X designates an object or specimen which is provided with terminals 5 and 6 and whose input impedance, for example, is designated by the reference character $R_x$. The terminals 1 and 3 are extended to a first two-pole connection module M1, while the terminals 2 and 4 are extended to a second two-pole connection module M2. In like manner, each of the terminals 5 and 6 is connected to the two poles of an associated two-pole connection module M3 and M4, respectively. Each connection module is illustrated in FIG. 1 by broken lines.

The switching matrix M is provided with a plurality of lines B1 to B16, by means of which selected modules may be operatively connected, to thereby enable the transmission or conduction of signals between selected pairs of terminals 1, 2; 3, 4; and 5, 6. Such lines may be in the form of bus lines, from which connections may be made over two available lines, i.e., not then in use, which are selected and connected to one of the terminal pairs 1, 2 and 3, 4 of the current supply device SG and the pair of terminals 5, 6 of the specimen X.

Considering first the terminal 1, which extends to the left-hand pole of the connection module M1, following suitable actuation of a relay X1 of such module, closure of make contact x1 of such relay may be effected, whereby the possibility then exists of reaching each of the even-numbered matrix lines B2, B4 . . . B16, with the latter connection being effected by closure of a selected make contact $a1, b1 \ldots h1$, respectively assigned to the individual lines, which closure is effected by energization of the corresponding relay A1, B1 . . . H1. Similarly, one of these lines can also be reached over the terminal 2, make contact X2 of relay X2 and one of the contacts $a2, b2 \ldots h2$ which are actuated by respective relays A2, B2 . . . H2. Likewise, beginning with the terminals 3 and 4, the odd-numbered lines B1, B3 . . . B15 can be seized, i.e., connected over the right-hand pole of M1 and M2 by energization of the relay Y1 to close contact y1 and over contacts $a1, b1 \ldots h1$ and contacts $a2, b2 \ldots h2$, when the contact y2 is closed. Consequently, by an appropriate control of the contacts a to h of all the connection modules M1 to M4, each of the lines B, not already seized over another connection module, can be seized over the connection modules M1 to M4. It will be apparent that the terminals 5 and 6 which extend to both poles of their associated connection module M3 and M4, it is possible to seize all available lines B1 to B16 which are assigned to the matrix.

As it is possible over each individual pole of a two-pole connection module M1 to M4, to have access to a line subgroup comprising half the number of the total lines B1–B16, insofar as the individual poles of the connection modules are concerned with their connections to respective peripheral terminals 1 to 4, results in the fact that each of such terminals is likewise assigned, for signal transmission purposes, only to one of the two line subgroups. In comparison, it will be noted from FIG. 1 that as the peripheral terminals 5 and 6 of the specimen X are each connected to both poles of an associated connection module, each such terminal has access to each matrix line B1 to B16, but this requires double the number of connection modules, as compared with an arrangement in which each individual pole of a connection module is assigned to a respective peripheral terminal of the specimen or device.

In order to extend the number of lines B1 to B16 assigned to a matrix, and which are accessible over a peripheral terminal, for example, the terminal 1, which is connected to only a single pole of a two-pole connection module, i.e., the module M1, in accordance with the invention, further switching means in the form of a contact $w1$ is provided, which can be actuated by means of a relay W1, over which the peripheral side of the make contact $x1$ can be connected to the matrix side of the contact $y1$, assuming that such contact is not closed and such pole thus being utilized. By means of such switch the total number of matrix lines which can be seized is doubled, as now the even numbered lines may be connected over switch means $w1$ and thus are available with the odd numbered lines.

A measuring voltage, for example, can be conducted from the terminals 1, 2 of the device SG to the terminals 5 and 6 of the specimen X over closed contacts $x1$, $x2$, two of the even-numbered lines B2 . . . B16, and closed contacts $x3$ and $x4$. If the voltage connected across terminals 5, 6 is now conducted back to the device SG over terminals 3 and 4, which in this case represents a regulating input, and if the latter are employed to adjust the amplitude of the measuring voltage in such a manner that the voltage across the terminals 5, 6 assumes a theoretical value, it is possible to refer to a four-pole operation of the device SG. In this case, the contacts $w1$ and $w2$ cannot be actuated as the transmission of the voltage value from the terminals 5, 6 to the terminals 3, 4 takes place over the closed contacts $y3$, $y4$ two of the odd-numbered lines B1 . . . B15, and closed contacts $y1$ and $y2$. Consequently, increase in the number of lines which can be seized over terminals 1 and 2 in the described manner by closing contact $w1$ and $w2$, respectively, can be achieved only when the four-pole operation of the device SG is replaced by a two-pole operation in which the terminals 3, 4 do not carry current, and consequently, no regulation of the measuring voltage amplitude takes place, i.e. contacts $y1$, $y2$ are open.

The setting of the switches in FIG. 1 illustrates the last mentioned situation, in which it is assumed that the terminal 2 is connected over contacts $x2$, $a2$, B2, $a4$ and $x4$ to terminal 6, whereas no other free line exists among the even-numbered lines B4 . . . B16 for connection of the terminal 1, whereby it it necessary to form a connection to terminal 5 over contacts $w1$, $h1$, line B15, contacts $h3$ and $y3$, and thus utilizing odd numbered line B15.

Contacts $w3$ and $w4$, which initially would appear superfluous in the circuit of FIG. 1 as the terminals 5, 6 are accessible to all lines B1 . . . B16, provide a further advantage by enabling the terminals 5 and 6 to be so designed that a subterminal $5_1$ is provided with a connection line 7 of relatively large cross-section, and a subterminal $5_2$ provided with a connection line 8 of relatively small cross-section, and in like manner corresponding to subterminals $6_1$ and $6_2$ may be formed. In accordance with this arrangement, the terminals $5_1$ and $6_1$ can be reached merely over the even-numbered lines B2 . . . B16, without actuation of switches $w3$ and $w4$, respectively, whereas they can also be connected to the odd-numbered lines of the matrix by means of contacts $w3$ and $w4$.

Figure 2:
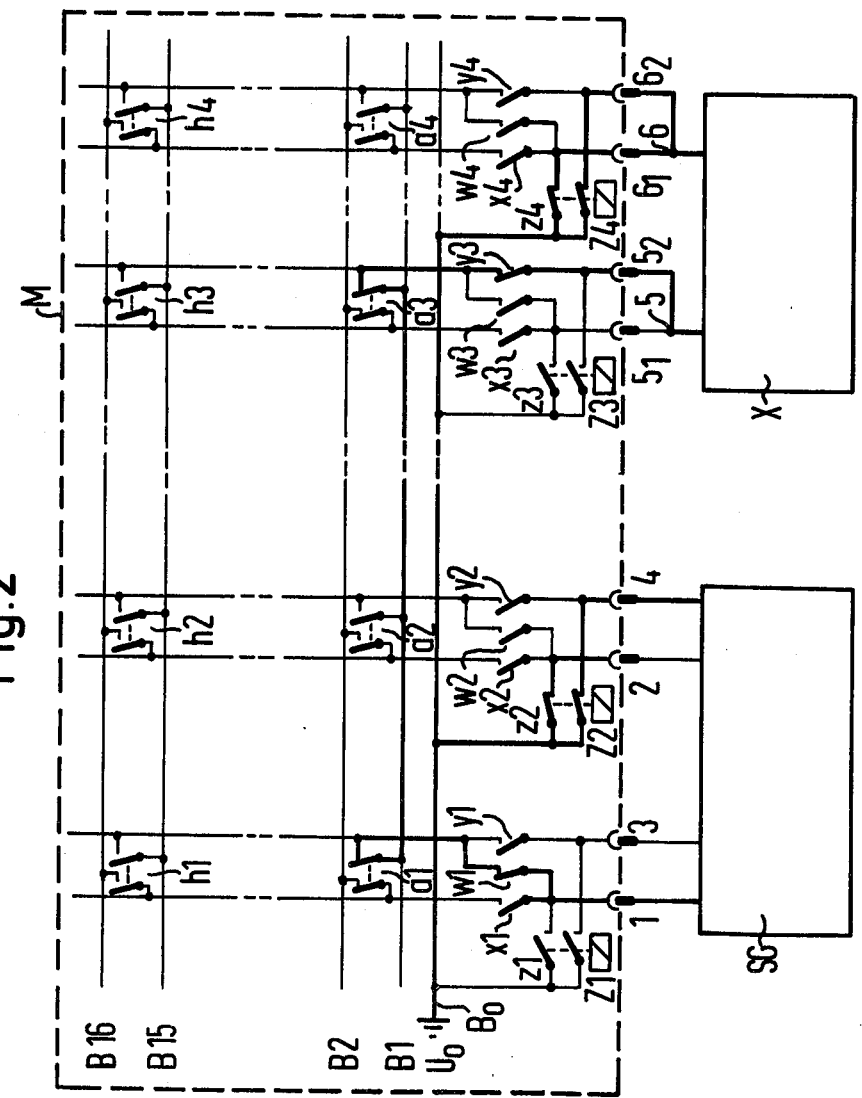
FIG. 2 illustrates a further improvement in the circuit illustrated in FIG. 1.

In accordance with a preferred further embodiment of the invention, as illustrated in FIG. 2, the peripheral sides of the make contacts x and y of the individual connection modules M1 to M4, may be provided with further make contacts $z1$ to $z4$ which, when actuated over corresponding relays Z1 to Z4, connect ground potential $U_o$, over an additional internal matrix line $B_o$ to the peripheral sides of the contacts x and y and thus to the associated terminals. This arrangement enables the transmission of asymmetrical signals, i.e. signals relative to ground potential $U_o$ over the switching matrix M, whereby a peripheral terminal, for example, the terminal 1, which is not connected to ground potential, can be connected to an odd-numbered line, for example, the line B1 over switch means $w1$, in the event that all the even-numbered lines to which it has access over contacts $x1$ are seized. The terminals 2 and 6, which in FIG. 1 are connected to ground, are thus connected to one another over line $B_o$ which is connected to ground potential $U_o$. It is assumed in FIG. 2 that the terminals 3 and 4 of the device SG are not carrying current.

The contacts $z3$ and $z4$ of the connection modules associated with the specimen terminals 5 and 6 can be employed, during transmission of symmetrical signals, to connect individual terminals of the specimen X to ground potential, for example, in order to set up a relay, to short-circuit amplifier inputs, to measure offset voltages, and similar functions. The circuit components illustrated in FIG. 2, which have not been specifically discussed, correspond to the components previously described with reference to the circuit of FIG. 1 and thus bear the same reference characters.

Figure 3:
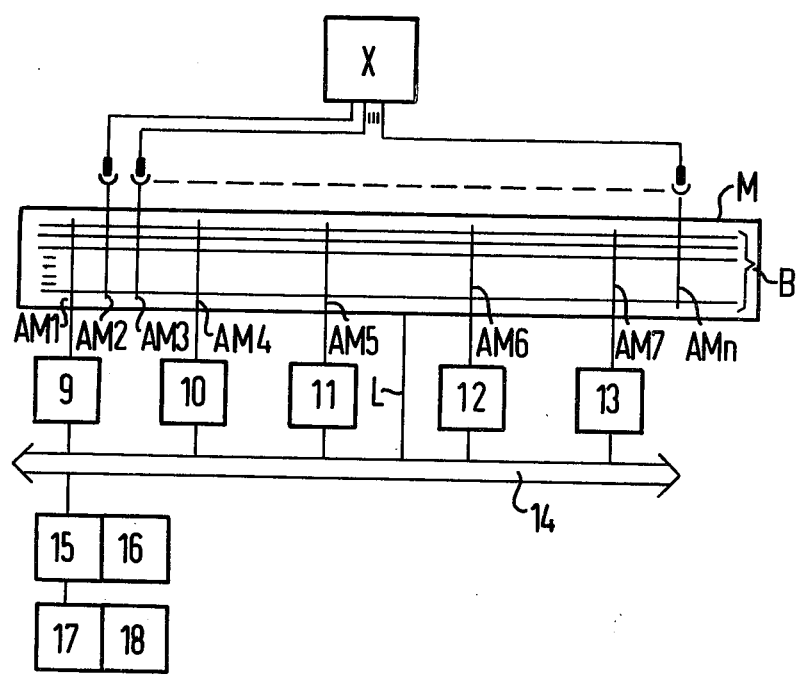
FIG. 3 is a block diagram illustrating the utilization of circuitry in accordance with the present invention in an extensive measuring circuit or system.

FIG. 3 illustrates a switching matrix M, designed in accordance with the invention, utilized in a larger measuring circuit. In this case, the transmission lines specifically assigned to the matrix are designated by the reference character B, whereas the two-pole connection modules are each depicted by vertical lines AM1 to Amn extending along the lines B. Over connection modules AM2, AM3, AMn and possible further connection modules, not illustrated, associated with the specimen X, it is possible to connect the specimen X over other respective connection modules and the lines B to other measuring devices and the like, such as a power supply device 9, a measuring transmitter 10, a selective analogue level meter 11, a digital level meter 12 and a counter 13.

Such devices are also connectable over a further system of bus lines 14 to a computer 15 which is also connected to an input device 16. A command for initiating a measurement, or commands for a sequence of measurements, are inserted into the input device 16 by suitable means, as for example, manual keying or in the form of measurement data stored on punched tape, punched cards, in magnetic stores or the like. As a result, the computer 15 is caused to address, over the bus line 14, the measuring devices which are necessary for execution of the specific measurement command and to connect these over the lines B of the switching matrix to one another or to the specimen X in desired manner, and to emit and receive measurement signals. The measured values which are finally obtained in the receiving measuring devices 11 and 12, and in particular digitalized by means of the counter 13, are then alphanumerically analyzed in a device 17, or pictorially represented or recorded in the form of measurement diagrams in a two-coordinate-display or recording device 18. The switching operations which take place in the individual switching modules AM1 to AMn and which are necessary to establish the desired connection lines between the devices 9 to 13 and the specimen X are checked by means of the computer 15, which for this purpose is connected over the bus line 14 and a plurality of connection lines L to the respective switching means of the switching matrix M to be controlled.

Having thus described our invention it will be obvious that although various minor modifications might be suggested by those versed in the art, it should be understood that we wish to embody within the scope of the patent granted hereon all such modifications is reasonably, and properly come within the scope of our contribution to the art.

We claim as our invention:

1. In a switching matrix provided with connection modules, for the connection of peripherally arranged electrical measuring devices, over selectable lines of a line group specifically associated with a matrix, to the peripheral terminals of specimens to be measured, such as electrical components, circuit boards, assemblies, communication devices and the like, wherein the connection modules are designed with two poles which may be rendered operative by controllable switching means, and over each of their poles provide access from such a terminal to separate line subgroups, from which a line is then selected over additional controllable switching means, the combination of each pole of a connection module being selectively connectable to a respective peripheral terminal of a specimen or a device over such first mentioned controllable switching means, and further controllable switching means for selectively connecting the first pole of a connection module to the second pole thereof at the matrix side of the first mentioned switching means associated with such second pole, in the event said last mentioned switching means is open.

2. A switching matrix according to claim 1, wherein a device can be connected by four-pole or a plurality of poles, of which a few terminals are continuously operative and other terminals are occasionally operative, with the first poles of the connection modules associated therewith being assigned to the continuously operative terminals, and the second pole thereof assigned to the occasionally operative terminals.

3. A switching matrix according to claim 1, wherein a specimen terminal is connected over two connection lines of differing cross-section to the two poles of an associated connection module.

4. A switching matrix according to claim 1, wherein further controllable switches are operatively connected to the poles of the connection modules at the peripheral side of the first mentioned controllable switching means, over which the poles may be connected to an additional line of the matrix which carries a reference potential.

5. A switching matrix according to claim 4, wherein a device can be connected by four-poles or a plurality of poles, of which a few terminals ae continuously operative and other terminals are occasionally operative, with the first poles of the connection modules associated therewith being assigned to the continuously operative terminals, and the second pole thereof assigned to the occasionally operative terminals.

6. A switching matrix according to claim 5, wherein a specimen terminal is connected over two connection lines of differing cross-section to the two poles of an associated connection module.

* * * * *